United States Patent
Uchida

[11] Patent Number: 5,974,064
[45] Date of Patent: Oct. 26, 1999

[54] TEMPERATURE COMPENSATION OF LASER DIODES

[75] Inventor: Toshi K. Uchida, Rancho Palos Verdes, Calif.

[73] Assignees: Optobahn Corporation, Torrance, Calif.; NGK Insulators, Ltd., Japan

[21] Appl. No.: 09/060,390

[22] Filed: Apr. 14, 1998

[51] Int. Cl.[6] .................................................. H01S 3/00
[52] U.S. Cl. ................................................ 372/38; 372/31
[58] Field of Search .................................... 372/31, 34, 38

[56] References Cited

U.S. PATENT DOCUMENTS

| | | | |
|---|---|---|---|
| 4,243,952 | 1/1981 | Patterson | 372/34 |
| 5,646,763 | 7/1997 | Misaizu et al. | 372/34 |
| 5,760,939 | 6/1998 | Nagarajan et al. | 372/34 |
| 5,761,230 | 6/1998 | Oono et al. | 372/34 |

*Primary Examiner*—Rodney Bovernick
*Assistant Examiner*—Robert E. Wise
*Attorney, Agent, or Firm*—Natan Epstein; Beehler & Pavitt

[57] ABSTRACT

A temperature compensated laser diode transmitter circuit includes a laser diode, a driver circuit for supplying an a.c. drive current to the laser diode, a thermistor arranged to thermally sense the laser diode, a current source having a first and a second current output controlled by the thermistor, the first current output connected to the driver for temperature compensating the drive current, and the second current output connected to supply a temperature compensated bias current to the laser diode.

10 Claims, 3 Drawing Sheets

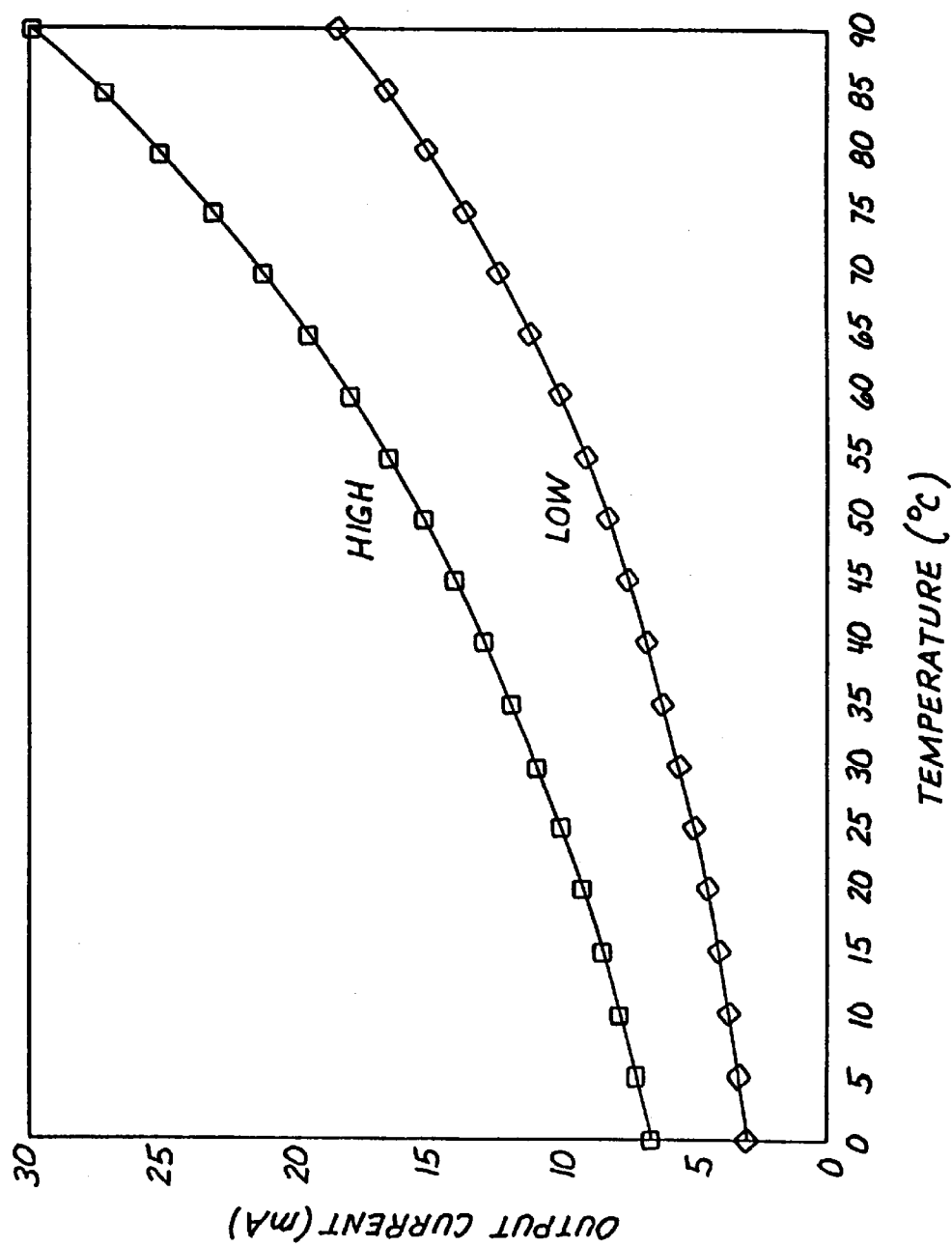

TEMPERATURE COMPENSATION OF LASER DIODES

BACKGROUND OF THE INVENTION

1. Field of the Invention

This invention relates to laser diode transmitters of the type used in fiber-optic communication systems and more particularly is directed to compensating circuits for correcting the light output of the laser diode against variations caused by changes in laser diode temperature.

2. State of the Prior Art

Semiconductor laser diodes are widely used as optical sources in fiber-optic communication links. The laser diode is driven by an alternating current (a.c.) which represents the information to be transmitted over the optical fiber. The optical output of the laser diode, now also carrying the desired a.c. signal, is coupled to a corresponding optical fiber which conveys the optical signal to a receiver coupled to the opposite end of the fiber, where the transmitted a.c. signal is recovered in electrical form for further processing. A given transmitter package may include one or several such laser diodes, each with a corresponding diode driver circuit and coupled to a corresponding optical fiber.

Laser diodes have a characteristic threshold current which must be exceeded before any light output is emitted by the diode. In typical transmitter packages the laser diode is supplied with a bias current which places the diode at the threshold of optical emission. This is done in order to maintain linearity and signal strength of the a.c. signal being transmitted. The a.c. signal supplied by the diode driver circuit may be any signal varying in amplitude over time, although in digital communications it normally consists of a digital pulse train. The a.c. drive current input to the laser diode results in emission of a light output having a time-varying characteristic, typically the amplitude or intensity of the light output, representative of the a.c signal and carrying the desired information.

Semiconductor laser diodes are sensitive to changes in temperature of the environment in that the threshold current increases with rising temperature while the output level or intensity of the emitted light decreases with rising temperature. The temperature variations of concern are changes in room temperature and/or heating in the instrument housing containing the laser diode transmitter. If no correction is made for this effect, the result is distortion of the a.c. signal carried by the light output as well as diminished overall intensity of the light output. Both these consequences impair the quality of the communications link and may result in outright failure of the link if the light output of the laser diode falls below the minimum level detectable by the receiver at the other end.

Much effort has been expended in devising means for correcting for this temperature susceptibility of laser diodes. The conventional approaches broadly fall into two categories: optical feedback and active cooling. The optical feedback approach involves actually sensing the light output of the laser diode with a photo-detector, and connecting the output of the photo-detector for increasing drive current to the laser diode to compensate for diminished output with rising temperature. Active cooling calls for refrigerating the laser diode by such means as Peltier junction devices in order to hold constant its temperature. The former approach fails to correct for changes in threshold current of the laser diode, while the latter approach consumes excessive power.

Attempts have also been made to adjust the bias and drive currents as a function of temperature to compensate for temperature induced changes in the corresponding laser diode operating characteristics. However, the changes in threshold current and drive current requirement as a function of temperature vary in a manner which can be generally approximated by an exponential function. Known efforts along these lines have relied upon microprocessor systems equipped with tables of stored values representing the diode currents at closely spaced temperature points through the operating temperature range of the laser diode. This approach requires digital memory as well as a microprocessor and supporting circuits, leading to undesirable complexity and excessive power requirements.

A continuing need exists for a more efficient approach to the temperature compensation of laser diodes.

SUMMARY OF THE INVENTION

This invention responds to the aforementioned need by providing an analog circuit for thermal compensation of laser diodes in optical transmitters in which laser diode temperature is sensed by a temperature dependent element such as a thermistor and the sensor output is used to control the level of the diode drive current as well as the diode bias current in order to correct for changes in laser diode operating temperature.

The novel circuit is entirely analog in design, avoiding the greater complexity and power consumption of digital processing, yet compensates for both the reduction in output power as well as the rise in threshold current of the laser diode with increasing temperature over a substantial range of operating temperatures.

More specifically, the temperature compensated laser diode transmitter circuit improved according to this invention has a laser diode; a driver circuit for supplying an a.c. drive current to the laser diode; a thermistor arranged in thermal sensing proximity to the laser diode; a current source having a first and a second current output controlled by the thermistor; the first current output being connected to the driver for temperature compensating the drive current; the second current output being connected for supplying a temperature compensated variable bias current to the laser diode. That is, the first current output is operative for increasing the amplitude of the a.c. drive current with increasing temperature sensed by the thermistor and the second current output is operative for supplying increased bias current with increasing temperature sensed by the thermistor.

The current source preferably includes a current mirror circuit supplying both the first and second current outputs. The thermistor may be connected as part of a resistance network in the current mirror circuit, including a parallel fixed resistance, selected to approximate a temperature compensating current output curve of the current mirror circuit.

The invention may also be summarized as a temperature compensation circuit for a laser diode transmitter of the type having a laser diode and a drive circuit for supplying an a.c. drive current to the laser diode thereby to derive a light output. In a presently preferred form the temperature compensation circuit has a single analog current mirror circuit having first and second current outputs connected respectively for controlling the amplitude of the a.c. drive current and for supplying a variable bias current to the laser diode, and a thermistor arranged in thermal sensing relationship to the laser diode and connected for controlling both of the current outputs so as to compensate each of the a.c. drive current amplitude and the laser diode bias current for variations in temperature of the laser diode.

These and other improvements, features and advantages of the present invention will be better understood by reference to the following detailed description of the preferred embodiments and the accompanying drawings.

BRIEF DESCRIPTION OF THE DRAWINGS

FIG. 3 shows two curves plotting the increasing amplitude of the a.c. modulated drive current and the rising bias current as a function of laser diode operating temperature.

DETAILED DESCRIPTION OF THE PREFERRED EMBODIMENTS

Figure 1:
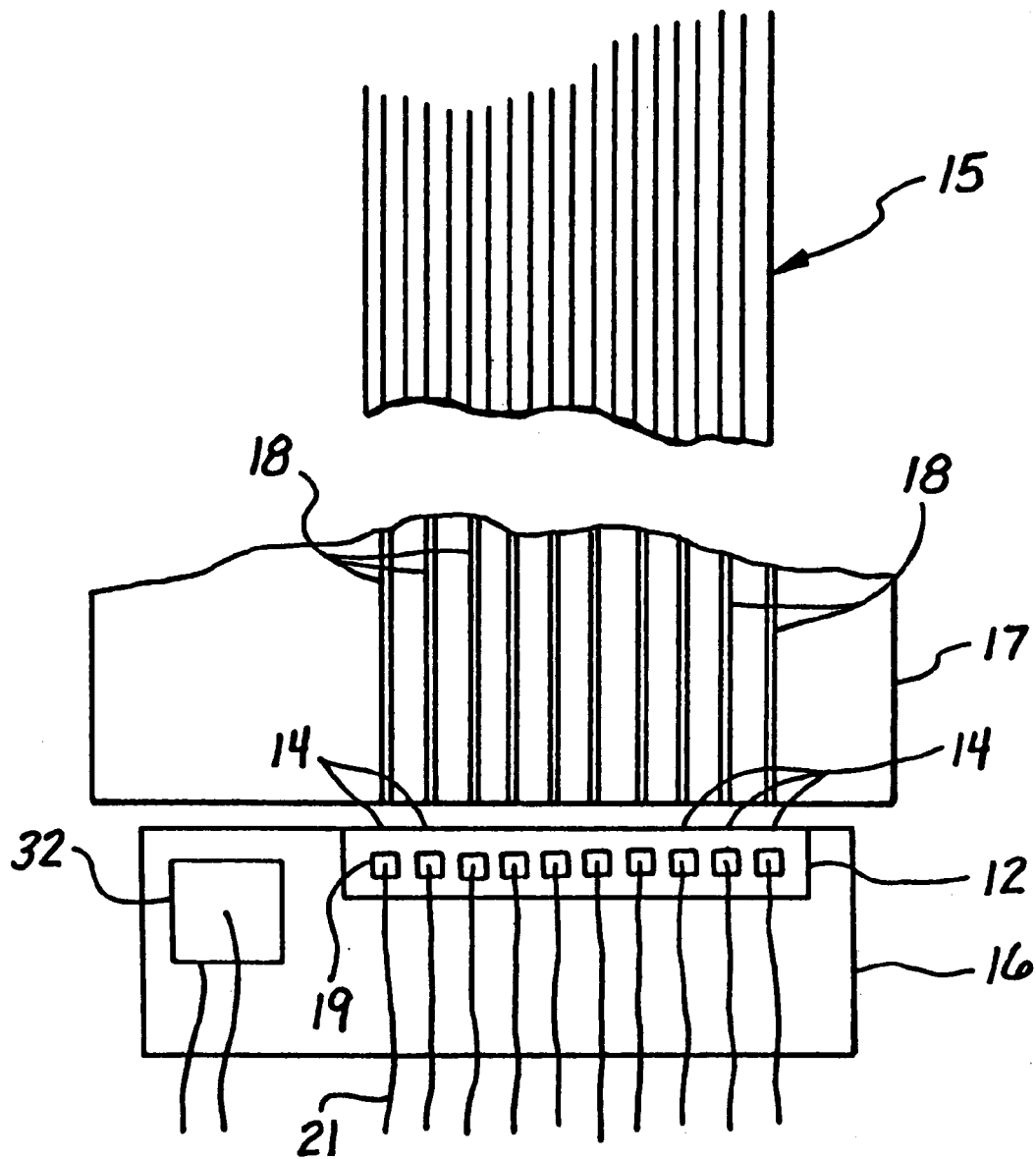
FIG. 1 is a perspective view of a typical laser diode and thermistor arrangement in a fiber optical transmitter.

With reference to the accompanying drawings in which like elements are designated by like numerals, FIG. 1 shows a laser diode array chip 12 which is mounted on a supporting substrate 16 and includes a number of individual laser diodes 14. An equal number of optical fibers 18 are supported on substrate 17 each with an end face in optical alignment with a corresponding one of laser diodes 14. Connection pads 19 are provided on the laser array chip for supplying electrical power to each diode 14 by means of supply wires 21, there being a common ground connection, not shown in the Figure. The optical fibers extend upwardly in FIG. 1 to make-up a multi-fiber cable 15, at the opposite end of which is a receiver (not shown) with photo-detectors for converting the optical signals from the fibers 18 to corresponding electrical signals for further processing.

Figure 2:
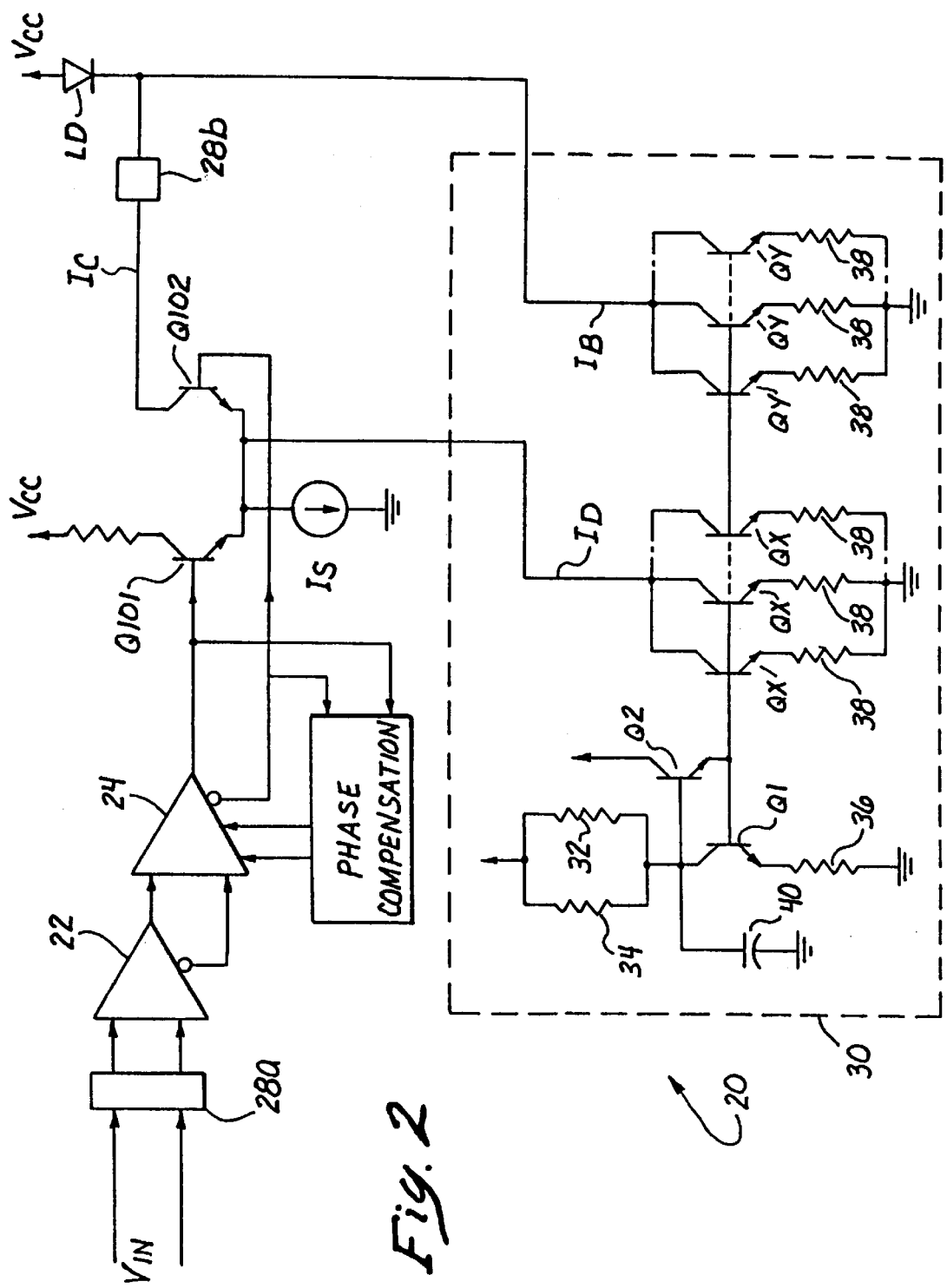
FIG. 2 is a schematic diagram of the analog temperature compensation circuit.

The laser diodes 14 are each driven by a corresponding driver circuit which delivers an alternating current modulated with the information to be conveyed by the emitted optical signals over the fibers 18. FIG. 2 depicts in block circuit diagram the driver circuit and associated temperature compensation circuit corresponding to one of the laser diodes 14. The circuit of FIG. 2 represents a single laser diode drive channel, and this circuit is repeated for each laser diode 14 of the diode array 12 to provide multiple parallel driver channels. For the sake of clarity only one such circuit is shown in the Figure. In typical high performance systems the driver circuits handle high frequency signals and in a presently preferred embodiment all the laser diode driver channels are implemented in silicon bipolar technology on a single integrated circuit, with, for example, 27 GigaHertz unity-gain frequency for IEEE standard PECO interface transmitters.

Turning to FIG. 2, the laser diode driver circuit generally designated by numeral 20, may be of conventional design and includes a first amplifier stage 22 functioning as a comparator which receives an alternating signal input $V_{in}$ and is followed by a second amplifier and phase compensation stage 24. The output of stage 24 drives transistor Q101 of differential transistor pair Q101, Q102. Transistor Q101 is connected between voltage supply $V_{cc}$ and a constant current supply circuit $I_s$, while transistor Q102 is connected between constant current supply $I_s$ and laser diode LD. The differential transistor pair delivers an a.c. drive current to the laser diode LD. The driver circuit includes suitable electrostatic discharge protection circuits 28a, 28b, at the input and output respectively.

The temperature compensation control circuit generally designated by numeral 30 includes transistors Q1 and Q2, and two groups of parallel connected load transistors Qx and Qy, all connected in a current mirror circuit configuration. The current mirror circuit is "programmed", i.e. its output current is determined by a programming current determined by a resistance network including thermistor 32 connected in parallel with fixed resistance 34, and emitter resistor 36. Capacitance 40 improves stability of the circuit. The thermistor 32 is physically positioned and mounted in thermal sensing proximity to the laser diode array 12 on common substrate 16, as shown in FIG. 1.

The current mirror circuit has two current outputs, a drive current control output $I_D$ supplied jointly by transistors Qx, and a variable bias current output $I_B$ supplied jointly by transistors Qy. The driver control current output $I_D$ is connected to the emitters of the differential transistor pair Q101, Q102 in parallel with the constant current source $I_s$. The variable bias current output $I_B$ is connected to the laser diode LD and supplies a continuous forward bias to the diode.

The temperature control circuit 30 is designed so that the variable bias current $I_b$ tracks changes in the threshold current level of diode LD with changes in the diode operating temperature. That is, the variable bias current varies with variations in the temperature sensed by thermistor 32. These changes in temperature may reflect changes in ambient temperature caused by environmental factors and/or by waste heat generated in an enclosure housing the optical transmitter package. Thermistor 32 is a negative temperature coefficient (NTC) device, so that as the threshold current level of diode LD rises with temperature, the bias current delivered by the compensation circuit 30 also rises to keep the laser diode close to its lasing light emission threshold.

The drive control current output $I_D$ likewise tracks variations in ambient temperature sensed by thermistor 32, and this control current is added to the constant current supplied by constant current source $I_s$. These two currents summed together control the amplitude of the a.c. drive current delivered to laser diode. The sum of constant current $I_S$ and drive control current $I_D$ controls and a.c. drive current output $I_C$ of the laser diode driver circuit 20. This $I_C$ drive current is actually a composite current in that it includes a d.c. component attributable to the influence of constant current source $I_S$ on the output of the differential transistor pair. This d.c. component contributes to the forward bias of the laser diode and is summed to the temperature compensating bias current $I_B$ to provide a base or minimum bias current.

The lasing efficiency of the diode LD decreases with rising temperature. Accordingly, the compensation circuit 20 is designed so that the drive control current varies in relation to temperature, increasing with rising temperature to increase the a.c. drive current delivered to the laser diode, and conversely, decreasing diode drive current with falling temperature, so as to maintain approximately constant the light power output of the diode over a range of operating temperatures of the optical transmitter and compensate for the characteristic response of the laser diode to ambient temperature changes.

The combined effect of the variable bias current and the drive control current is to maintain the modulated light output of the laser diode within an acceptable range of output power levels and modulation over an intended operating temperature range of the transmitter package. It is preferred to implement the temperature compensation circuit 30 on-chip together with the driver circuit 20 for best temperature stability as well as for cost and size considerations. Presently preferred values and part number for select components of the compensation circuit 30 are given by the following Table 1.

TABLE 1

| Thermistor 32 | HM35NF-103K |
|---|---|
| Fixed resistance 34 | 3 kilo Ohms |
| Emitter resistance 36 | 115 Ohms |
| Emitter resistance 38 | 80 Ohms |
| Capacitance 40 | 2 pico Farads |

In a presently preferred mirror circuit, the first load transistor group includes 3 transistors Qx while the second load transistor group includes 6 transistors Qy, each with a corresponding emitter resistance 38. In an exemplary circuit, which has an intended operating temperature range of 0° C. to 90° C., Table 2 below lists values for the drive control current $I_D$, the variable bias current $I_B$, constant current $I_S$ and thermistor resistance $R_T$ at two widely spaced temperature points.

TABLE 2

| T | $I_B$ | $I_D$ | $I_S$ | $R_t$ |
|---|---|---|---|---|
| 25° C. | 2.56 mA | 5.18 mA | 2.57 mA | 10 Kohms |
| 80° C. | 7.18 mA | 14.52 mA | 2.57 mA | 1.2 Kohms |

The current contributed by each transistor Qx and IQy is the total current output of the corresponding load group divided by the number of transistors in that group, i.e. three transistors Qx and six transistors Qy.

The laser diode threshold current $I_b$ as a function of temperature for a typical laser diode is given by the following exponential function:

$$I_b = 10 \cdot e^{\frac{T-25}{60.02}}$$

where the denominator of the exponent is the current gain of transistors Qy in the current mirror circuit, while the temperature dependent laser diode drive current function for the same device, i.e. the drive current $I_c$ required to maintain a constant light output is approximated, as a best fit to experimentally derived data, by the following expression, which is also an exponential function:

$$I_c = 25 \cdot e^{\frac{T-25}{50.06}} - 10 \cdot e^{\frac{T-25}{60.02}}$$

where T is the temperature of the laser diode device and the denominators in the first and second exponents of the difference equation are the current gain factors of the transistors Qx, Qy respectively in the current mirror circuit.

The drive and bias currents $I_C$ and $I_B$ actually delivered by circuit 30 over a given temperature range can be made to follow these exponential functions to within 5 or 10% as a result of a combination of several temperature dependent circuit parameters, primarily the variable resistance of thermistor 32, but also the temperature variation of the current gain of transistors Qx, Qy in the current mirror circuit, the temperature induced variation in the current gain of the differential pair, and non-linear operation of the differential transistor pair Q101, Q102.

Notwithstanding its analog nature, the current outputs $I_C$, $I_B$ of the temperature compensated laser diode drive circuit 20 of this invention change with temperature in a manner which sufficiently approximates the above mentioned exponential functions Measured circuit performance shows that the temperature compensated bias and drive currents delivered by the circuit of this invention can generally approximate the actual exponential function to within about ±5%, a result which has been found quite satisfactory in operation of the optoelectronic transmitter.

FIG. 3 shows two curves labeled High and Low. The High curve plots the maximum or peak a.c. drive current output or $I_C$-max and the Low curve plots the bias current output $I_B$, both over an operating temperature range of 0° C. to 90° C. of the laser diode LD. These two curves depict the actual currents delivered to the laser diode but are based on a limited number of data points and so do not show current fluctuations above and below the curves which actually occur. However, these fluctuations remain within about the aforementioned ±5% figure of the values indicated by the two curves.

The vertical spread between the upper and lower curves represents the amplitude swing of the a.c. drive current $I_C$, plus its d.c. component mentioned earlier. That is, the lower curve represents the temperature compensating bias current $I_B$ which keeps the diode LD at or near its lasing threshold. To this is summed the composite a.c./d.c. modulated drive current $I_C$ responsible for the modulated light output of the laser diode. As seen in FIG. 3 drive current $I_C$ rises more steeply with increasing temperature than the bias current output $I_B$ over the same temperature range, resulting in increasing amplitude of the a.c. component swing with increasing temperature, to compensate for diminishing efficiency of the laser diode.

From the foregoing description it will be appreciated that the laser diode temperature compensation circuit is entirely analog in design so that it may be conveniently implemented on board a high frequency integrated circuit laser diode driver with a minimum of external parts.

While a particular embodiment of the invention has been described and illustrated for purposes of clarity and example it must be understood that many changes, modifications and substitutions to the described embodiment, including various choices and adjustments to the operating circuit parameters needed to obtain a desired current output/temperature response of the compensation circuit, will be apparent to those having ordinary skill in the art without thereby departing from the scope of this invention as defined in the following claims.

What is claimed is:

1. A temperature compensated laser diode transmitter circuit, comprising:
    a laser diode;
        a driver circuit for supplying an a.c. drive current to said laser diode;
        a thermistor arranged in thermal sensing proximity to said laser diode; and
        a current source having a first and a second current output controlled by said thermistor;
        said first current output connected to said driver for temperature compensating said drive current; said second current output connected for supplying a temperature compensated bias current to said laser diode.

2. The temperature compensated circuit of claim 1 wherein said first current is operative for increasing the amplitude of said a.c. drive current with increasing temperature sensed by said thermistor.

3. The temperature compensated circuit of claim 1 wherein said temperature compensated bias current increases with increasing temperature sensed by said thermistor.

4. The temperature compensated circuit of claim 1 wherein said current source comprises a current mirror circuit supplying both said first and second current output.

5. The temperature compensated circuit of claim 1 wherein said thermistor is connected in parallel with a fixed resistance.

6. The temperature compensated circuit of claim 1 wherein said current source is an analog circuit.

7. The temperature compensated circuit of claim 6 wherein both said a.c. drive current and said bias current each varies along an exponential temperature compensated current output curve responsive to temperature induced variations in resistance of said thermistor.

8. The temperature compensated circuit of claim 7 wherein said a.c. drive current has an amplitude which increases with increasing temperature sensed by said thermistor.

9. A temperature compensated laser diode transmitter circuit, comprising:

a laser diode, a driver circuit for supplying an a.c. drive current to said laser diode thereby to derive a light output, an analog current supply circuit having a first and a second current outputs, a thermistor positioned in thermally responsive proximity to said laser diode and connected in said analog current supply circuit for controlling both said first and said second current outputs, said first of said current outputs being connected to said driver circuit for controlling the amplitude of said a.c. drive current, said second of said current outputs being connected for supplying a bias current to said laser diode, such that both drive current amplitude and diode bias current are compensated for temperature variations of said laser diode thereby to reduce variations in said light output.

10. A temperature compensation circuit for a laser diode transmitter of the type having a laser diode and a drive circuit for supplying an a.c. drive current to said laser diode thereby to derive a light output, comprising: a single analog current mirror circuit having first and second current outputs connected respectively for controlling the amplitude of said a.c. drive current and for supplying a bias current to said laser diode, and a thermistor arranged in thermal sensing relationship to the laser diode and connected for controlling both of said current outputs so as to increase the amplitude of the a.c. drive current amplitude and also increase the laser diode bias current in generally exponential relationship with the operating temperature of the laser diode thereby to reduce variations in laser diode light output over a range of operating temperatures.

* * * * *